United States Patent [19]

Costabello

[11] Patent Number: 5,058,068
[45] Date of Patent: Oct. 15, 1991

[54] REDUNDANCY CIRCUIT WITH MEMORIZATION OF OUTPUT CONTACT PAD POSITION

[75] Inventor: Claude Costabello, Marseille, France

[73] Assignee: SGS-Thomson Microelectronics, Gentilly, France

[21] Appl. No.: 616,634

[22] Filed: Nov. 21, 1990

[30] Foreign Application Priority Data
Nov. 24, 1989 [FR] France ................. 89 15508

[51] Int. Cl.$^5$ .............................................. G11C 7/00
[52] U.S. Cl. ................................... 365/200; 365/104; 365/185; 365/189.02; 365/230.03; 365/230.06; 365/231; 371/10.3
[58] Field of Search .............. 365/200, 189.02, 230.03, 365/210, 230.06, 231, 103, 104, 184, 185; 371/10.3, 11.1; 307/449, 594

[56] References Cited

U.S. PATENT DOCUMENTS

| 3,868,646 | 2/1975  | Bergman      | 340/172.5 |
|-----------|---------|--------------|-----------|
| 4,456,975 | 12/1985 | Smith et al. | 365/200   |
| 4,471,472 | 9/1986  | Young        | 365/200   |
| 4,672,240 | 6/1987  | Smith et al. | 307/449   |
| 4,688,219 | 8/1987  | Takemae      | 365/200   |
| 4,691,301 | 9/1987  | Anderson     | 371/10.3  |
| 4,768,193 | 8/1988  | Takemae      | 371/10.3  |
| 4,800,535 | 1/1989  | McAlpine     | 365/200   |
| 4,819,205 | 4/1989  | McRoberts    | 365/200   |
| 4,831,285 | 5/1989  | Gaber        | 307/594   |
| 4,860,260 | 8/1989  | Saito et al. | 365/200   |
| 4,881,200 | 11/1989 | Urai         | 365/230.03|

FOREIGN PATENT DOCUMENTS 0242854 10/1987 European Pat. Off. .
1546833 10/1968 France .
2611301 8/1988 France .
1158010 7/1969 United Kingdom .

OTHER PUBLICATIONS

K. E. Grosspietsch, "Schemes of Dynamic Redundancy for Fault Tolerance in Random Access Memories", *IEEE Transactions on Reliability*, No. 3, Aug. 1988, pp. 331–339.

*Primary Examiner*—Joseph E. Clawson, Jr.
*Attorney, Agent, or Firm*—Richards, Medlock & Andrews

[57] ABSTRACT

The disclosure concerns integrated memories and their redundancy circuits. The described redundancy concerns the memories organized in k groups of p columns (for example k=8 and p=64) to give words of k bits, when one column address out of p is chosen. The addresses of defective columns are memorized. In certain cases, the pad position (p0, p1, p2, p3) corresponding precisely to the defective column is also memorized. It is proposed to reduce the space occupied by the pad position determining logic circuits for which a redundancy has to be activated. This reduction is obtained by organizing a matrix EPROM to contain, for each defective column address, a memorized corresponding pad position. If there are N possibilities of repairs and r possible pad positions, the memory includes N lines and r columns. This is more than necessary, but that makes it possible to gain more space in avoiding the use of bulky logic decoders.

6 Claims, 2 Drawing Sheets

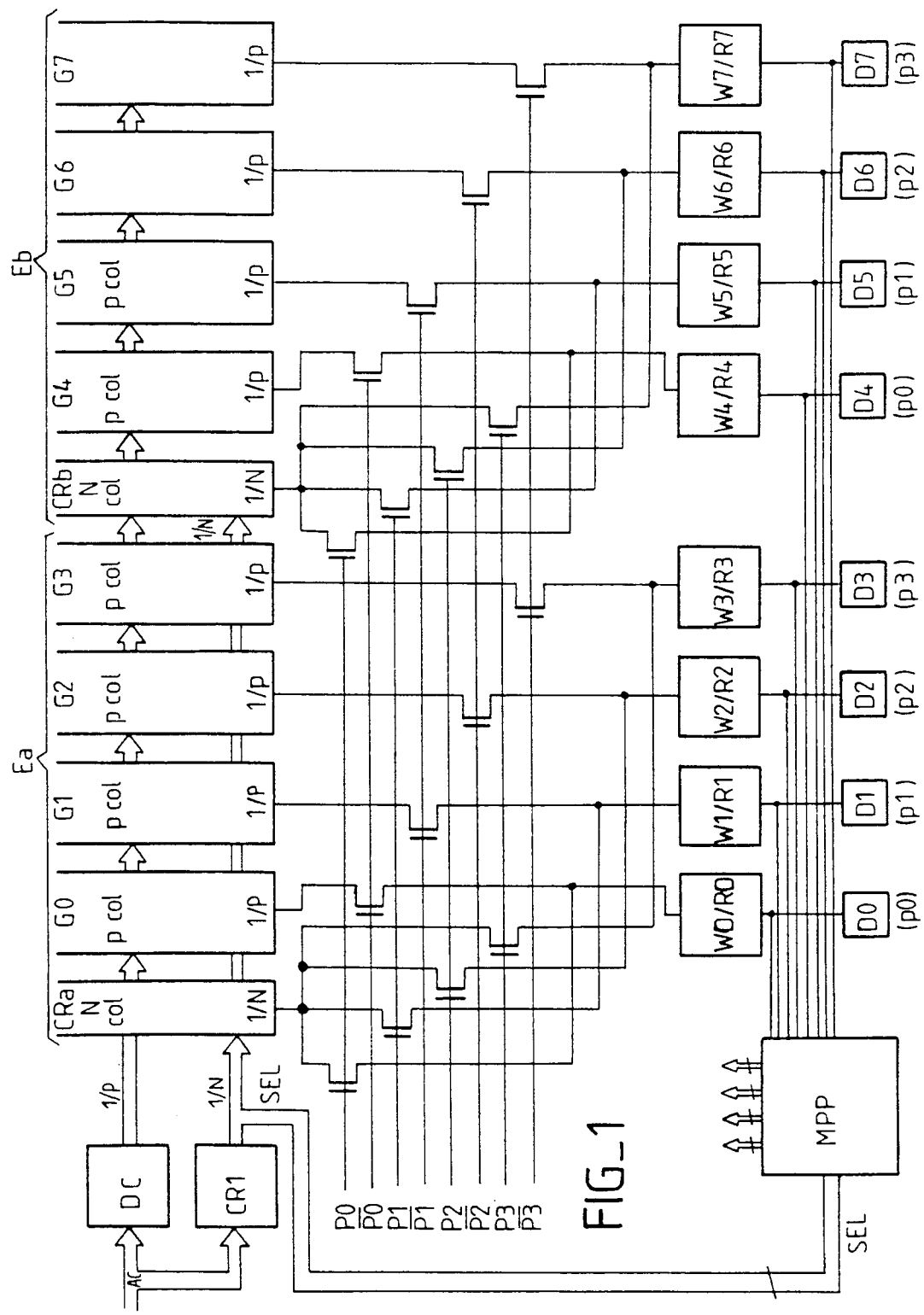

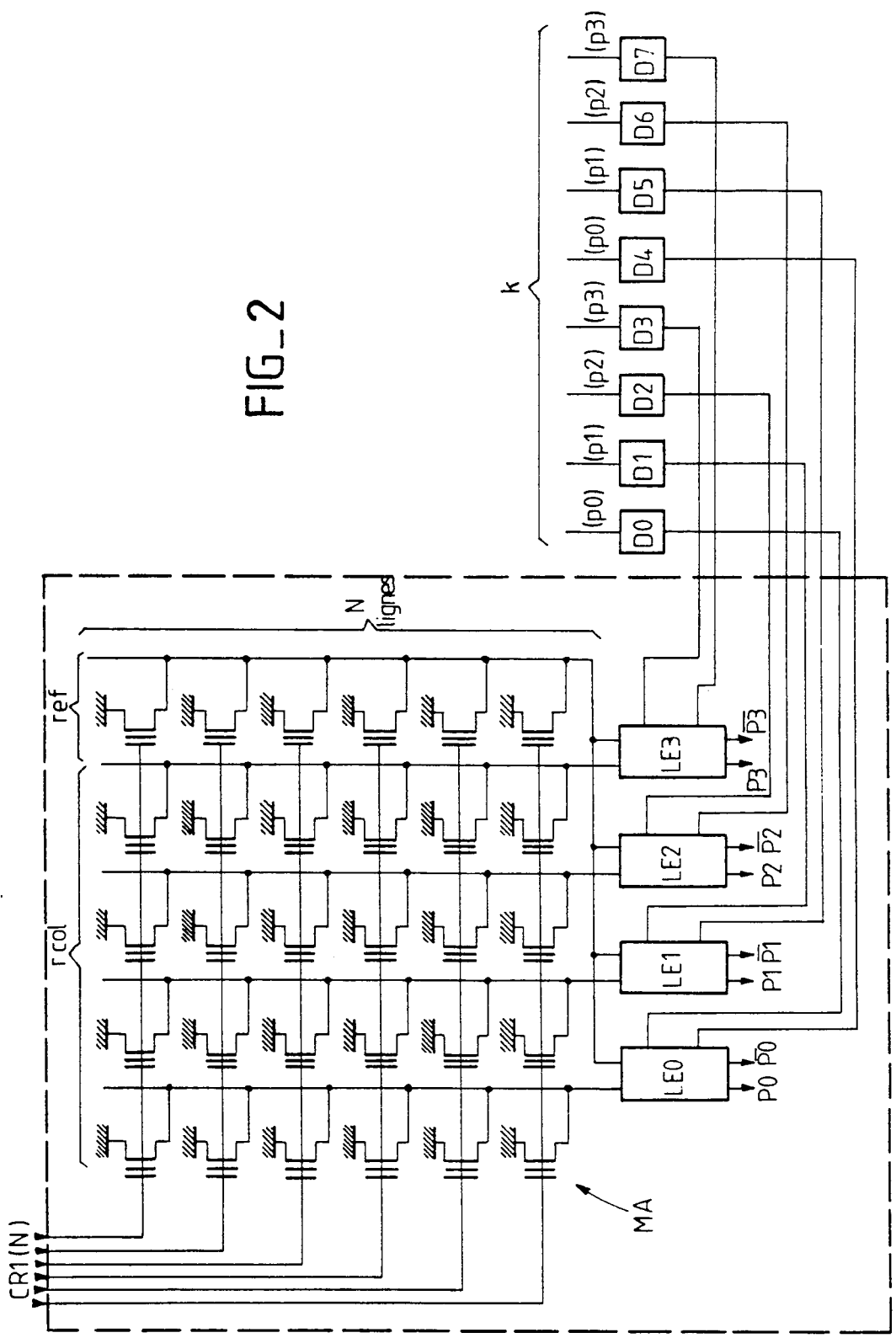
FIG_2

REDUNDANCY CIRCUIT WITH MEMORIZATION OF OUTPUT CONTACT PAD POSITION

BACKGROUND OF THE INVENTION

1. Field of the Invention

The invention concerns memories made in integrated circuit form. It also concerns random-access memories (RAMs) as well as read-only memories (ROMs, EPROMs or EEPROMs). However, it is particularly valuable in the case of flash EPROMs which are electrically programmable and electrically erasable by blocks.

More precisely, the invention concerns the redundancy systems associated with these memories.

2. Description of the Prior Art

The French Patent Application 87/02372 filed on Feb. 24, 1987 and published as French Patent Application Publication No. 2,6111,301 on Aug. 26, 1988 describes a redundancy system aimed at optimizing the possibilities of repairing defective columns by means of a limited number of redundancy columns, when the memory is organized ion lines and columns with a number of columns that is a multiple of the number of data output pads of the memory. In other words, the memory is designed to give words of k bits (for example k=8) and there are k times p columns (for example p=64). The memory has k groups of p columns and the selection of a word in the memory is done by the simultaneous selection of a single column in each group. The text of the French Patent Application can be consulted for more details.

The redundancy system of the French Patent Application is based on the idea that the number of redundancy columns will be limited by memorizing not only the address of a defective column (1 among p) designed to be replaced by a redundancy column but also a position of the pad corresponding to the defective column.

The position of the pad is not necessarily the one having the rank 1 among k ranks of the pad. In the French Patent Application Publication, it is somewhat fictitious position chosen in the following way: k pads are arranged in m sets of r pads, and a redundant column or a group of redundant columns is associated with each set. The "pad position" is one position among r positions of the pad within the set to which it belongs. To give a numerical example, if there are eight pads (k=8) arranged in four sets (m=4) of two pads (r=2), there are two possible pad positions in each set, which could be called position 0 and position 1. When a defective column is detected and has to be replaced by a redundant column, not only is this defective column replaced by a redundant column, but also there is a simultaneous replacement of all the (non-defective) columns that correspond to the same pad position in the other sets and are selected by the same column address. Thus, in the numerical example given here above, if a defective column corresponding to a pad position 1 is identified, the putting into operation of the redundancy will consist in the replacement, by a respective redundant column, of the four position 1 columns which are selected by a defective column address. But columns having the same column address but with pad position 0 are not replaced.

This redundancy system is therefore based on the permanent memorizing of several pieces of information pertaining to the defective columns.

Firstly, addresses of defective columns are memorized, in a memory of defective column addresses. Each address makes it possible to designate one defective column among p in a group of p columns without distinction among the k groups. A comparator permanently monitors the addresses applied to the memory, in reading as well as in writing. If a defective column address appears, the comparator reacts by indicating that the redundancy must be put into operation. It also indicates the repair number that should be triggered when, as is generally the case, several possibilities of repairing are provided for, and are identified by numbers.

Then, for each repair number, the pad position corresponding to the actually defective column is memorized, without any distinction among the sets. This information is recorded in pad position memorizing elements. When a defective address appears at the input of the memory, it is identified by the comparator. The comparator determines the repair number that has to be put into operation, and gives a corresponding piece of information enabling the selection of the pad position memorizing elements which correspond to this number. The selected elements define a pad position. All the groups of columns that correspond to this position will undergo a replacement of a column (defective or not) by a redundant column.

In practice, in the prior patent application FR 87/02371, the pad position memorizing elements are fuses: if there are only two pad positions, one fuse alone will be enough to define this position. If there are four of them, two fuses will be needed, etc. These fuses will be needed for each repair number.

When there is only one pad position out of two to be defined, the practical construction is fairly simple: it is enough to have simple logic circuits to:

receive a piece of information on a repair number from the comparator;

select the memorization element (the fuse) that corresponds to this number, as a function of this piece of information, and examine the state of the corresponding fuse, to set up an instruction for the selection of the pads for which the pad position is the one indicated by the fuse.

Although this situation is fairly simple, it should be pointed out all the same that it must take account of the need to record the information on pad position. In one approach using fuses, it can be imagined that the fuses will be blown out by laser, in which case no circuitry is needed for the recording. This is the approach adopted in the already-mentioned Patent Application 87/02372. However today, for reasons of automation, it is preferred to do an electrical recording. This enables the recording to be done immediately when the existence of defective columns is detected. For an electrical recording, the corresponding circuitry is needed. This is true for a memorizing operation using a fuse, but it is also true if the memorizing element is a floating gate transistor, now coming into increasing use as a permanent information memorizing element.

Where the situation gets extremely complicated is when the number of pad positions to be memorized increases along with the number of possibilities of repair. Indeed, in this case, a very fast complex decoding is needed to:

firstly, select a group of fuses among N, if there are N possible repair numbers;

secondly, designate the different pad positions corresponding to the state of the different fuses or transistors for a given repair number;

and finally, record the state of the pad position memorizing elements, when the memory is tested.

For example, if there are six possible repairs and eight pad positions, there should be six groups of three fuses or transistors, and a complex decoding to set up the connections that are suitable for choosing one group among six, and to:

select the redundancy columns having a same position, this position being defined by the state of a group of three fuses;

electrically record the state of the fuses on the basis of the result of the test showing that there is a defective column.

In practice, the piece of information on pad position to be recorded electrically should come from somewhere. It will be seen that it comes from the pad on which a fault has been identified. This assumes, therefore, that pad position memorizing elements are connected in one way or another to the corresponding pads in order to do the recording.

All the connections, decoders and routings necessary make it fairly difficult to implement this principle of redundancy with memorization of the position of pads.

Besides, the difficulty does not lie solely in a circuit where the k pads are arranged in m sets of r pads with one pad position among r defined simultaneously for all the sets. It also exists in the borderline case where $m=1$, i.e. in the case where the pad position is one position among k in a single set of k pads.

The present invention proposes to resolve this difficulty by increasing the number of pad position memorizing elements in relation to what is strictly necessary, and by organizing these element in the form of a matrix of electrically programmable memory cells (floating gate transistors).

The access to the matrix is got linewise by conductors coming from the comparator (comparing the memory addresses received with the defective column addresses), each conductor corresponding to a repair number and to a respective line of the matrix; the output is done column wise towards read/write circuits associated with each column. Each read/write circuit corresponds to a pad position and, during the pad position recording stage, it receives a piece of information coming from a pad corresponding to this position.

Each column of the memory corresponds to a respective pad position. The appearance of a determined bit on this column corresponds to the selection of a determined pad position. It is thus that, on N lines, it is possible to memorize N different pad positions which are the positions corresponding to N different defective columns.

In one example with six possibilities of repair and eight pad positions, there will be 48 floating gate transistors organized in matrix form, while the standard construction would entail only 18 floating gate transistors. However, an enormous gain is obtained with respect to the corresponding decoding circuitry, moreover without complicating the programming operation: the programming will be done line by line (six lines), directly on the basis of a piece of information coming from a pad.

SUMMARY OF THE INVENTION

The invention can be defined as follows:

It comprises an integrated memory with k output pads, including a redundancy circuit, said circuit including elements for memorizing a position of an output pad corresponding to a defective column, wherein the pad position memorizing elements are electrically programmable memory cells, equal in number to the number N of possible repairs multiplied by the number r of possible pad positions, organized in an auxiliary memory of N lines and r columns (each column corresponding in principle to a determined pad position).

The invention is especially valuable in the case of electrically erasable memories (EEPROMs), flash EPROMs) or memories that are not at all erasable (ROMs, UPROMS) in contradistinction to memories erasable by ultraviolet light. Indeed, for the UV erasable memories, which include a window transparent to ultraviolet light, a special anti-UV masking should be provided on top of the pad position memorizing matrix. For, it is necessary not to erase the redundancy information. This masking is cumbersome for it necessarily includes anti-light labyrinths. The use of such memories would reduce the value of the invention.

BRIEF DESCRIPTION OF THE DRAWINGS

Other characteristics and advantages of the invention will appear from the following detailed description, made with reference to the appended drawings in which:

FIG. 1 represents a general diagram of an embodiment of the invention;

FIG. 2 gives a more precise view of the constitution of the block for memorizing pad positions.

DESCRIPTION OF A PREFERRED EMBODIMENT

The embodiment which shall be described in detail in order to explain the invention more clearly corresponds to an example inspired by the Patent Application FR 87/02372 (with numerical modifications). It will be easy to deduce, therefrom, the modifications necessary for other examples and, in particular, for a simpler example in which the output of the eight-bit words takes place on eight pads, each identified by one out of eight positions.

The example described hereinafter is set up on the basis of a simplified practical example in which there is one memory of $k=8$ output pads D0 to D7 to extract eight-bit words. The memory is organized in eight groups of columns, each group G0 to G7 including p columns (for example $p=64$) and corresponding to a respective pad D0 to D7.

The pads are divided into $m=2$ sets of $r=4$ pads, and in each set, a respective pad position (1 among r) is defined for each pad. The positions are called p0, p1, p2, p3. The pads D0 and D4 have the position p0, each in its set, the pads D1 and D5 have the position p1, etc.

The groups are divided in to two sets Ea and Eb exactly like the pads, since there is a corresponding pad for each group.

There is a respective group of redundancy columns associated with each set Ea and Eb, namely the group CRa for the set Ea, CRb for the set Eb.

From this point onwards, it can be stated that the invention is applicable irrespectively of the number m of sets, including $m=1$, in which the case the position of each pad is a position from 1 to k, and there is no pad having a determined position.

The memory includes a column decoder DC (which is present independently of the redundancy) to make a selection, when a column address AC is applied to the memory, of one among p columns in each of the groups simultaneously, thus enabling the application of an eight-bit word to the outputs D0 to D7.

In the rest of the description, we shall refer essentially to reading even if the memory is recordable. For the writing, the eight-bit word is applied to the pads D0 to D7 which then serve as data inputs and not data outputs.

The address AC therefore enables the selection of one useful column among p columns at output of each group.

Simultaneously, this address AC is applied to a redundancy circuit which includes, a first of all, a block CR1 designed to ascertain the need for a column-repairing operation and to partially select the redundancy columns used for this operation.

The block CR1 includes, firstly, addresses of memorized defective columns and, secondly, means of comparison between the addresses received by the memory and the addresses that are memorized.

If it is assumed that there are N possibilities of the simultaneous repairing of defective columns, there are N addresses AC in memory. The address is the address of one column among p, i.e. it does not take account of the group in which the defective column is located. If there are 64 columns, the addresses AC are 6-bit addresses, and the circuit CR1 includes N groups of 6 memorizing elements which may be floating gate transistors (unerasable EPROMs or UPROMs) or fuses.

The block CR1 receives the addresses AC, compares them with the N memorized defective addresses, and gives a command, on a bus of N lines (or 2N lines if the signals and their logic complements are counted), for the selection of one redundancy column among N in each of the sets Ea, Eb namely in each of the groups, CRa, CRb.

When a defective address is detected, one redundancy column among N is selected at output of each group CRa, CRb, just as a normal column is selected at output of each group G0 to G7.

At output of the columns thus selected, whether they are normal columns or redundancy columns, there is a multiplexer designed to choose whether the information transmitted to the pads should come from a normal column addressed by the decoder DC or a redundancy column addressed by the circuit CR1, and to do so individually for each of the groups or normal columns or for each of the groups of redundancy columns.

This multiplexer is controlled by signals P0, P1, P2, P3 (and this logic complements) which correspond to the positions of pads of the defective columns identified at the time of the test.

The multiplexing is as follows: if no pad position is selected (no need for repairs), P0 to P3 are all null. Any transmission from the redundancy columns to the pads or vice versa is barred. Transmission between the selected normal columns and the corresponding pads is permitted.

If a repair is necessary and if it corresponds to the pad position p0 (P0=1, P1, P2, P3 null), then the transmission from the groups of normal columns having a position p0 (G0 and G4) towards the pads having a position p0 (D0 and D4) is barred and replaced by a transmission towards these same pads, respectively, of the redundancy column selected by CR1 in each of the groups CRa and CRb. For the other pad positions, the transmission between the normal columns and the pads remains permitted and the transmission between the redundancy columns and the pads remains barred.

The same applies to each of the other positions of the pad: the exchange between a normal column and a redundancy column is made only for the pad position identified by a non-null logic signal.

The signals P0 to P3 representing the pad positions come from the pad position memorizing block MPP which includes N groups of memorization elements that can be selected by the block CR1.

Finally, the normal or redundancy columns selected by the multiplexer are connected to the respective pads not directly but by means of a respective read/write circuit associated with each pad. The read/write circuits are designated by W0/R0 for the first pad, W1/R1 for the second pad, etc.

The pad position memorizing block MPP is shown in detail in FIG. 2. It is set up in the form of an auxiliary matrix memory, with circuits for the reading and writing of the data stored in this auxiliary memory.

The auxiliary memory MA includes N lines of electrically programmable memory cells and r columns, N being, it may be recalled, the number of possible repair operations, and r being the number of possible pad positions in each of the m sets (m may be equal to 1, in which case r is equal to the total number k of pads). Each cell is preferably a floating gate transistor of the EPROM or UPROM. These cells are electrically recordable and unerasable.

The total number of cells is far greater than what is strictly necessary, and the higher r is, the more this is so. For r=4, the number of cells is twice the number strictly necessary (4N instead of 2N); for r=8, the ratio is even higher (8N instead of 3N).

But, because of this, cumbersome decoding circuits are completely avoided.

The addressing of this memory MA of the block MPP is done by N line conductors, each cell line comprising a line conductor connecting the control gates of the floating gate transistors of this line. The N control gates come from a bus of N conductors coming from the block CR1. This bus is available at the output of the circuit CR1 since, as has been explained, the function of the circuit CR1 is to select o ne column among N in the groups of redundancy columns.

Consequently, whenever one determined redundancy column is selected from among N (corresponding to a determined repair number), a line of the memory of the block MPP is selected at the same time.

A word of r bits is then read on the columns of the memory. However, the programming of the memory of the block MPP is done in such a way that the words of r bits of this memory actually include only one bit different from the others (for example a bit 1 among r-1bits 0). This is possible because the memory has r columns and because it is sought to store precisely one pad position among r in this memory.

Consequently, a bit 1 will be read on a column conductor of the memory MPP, this conductor then defining the pad position corresponding to a defective column: to each column conductor of the memory, there corresponds a single determined pad position and vice versa.

The reading of the memory (and also, writing) is done in a very standard way for EPROMs, through a respective read/write circuit for each column. The read/write circuits are designated by LE0 to LE3 for the columns representing p0 to p3 respectively.

If desired, it is possible, as is commonly done in certain EPROMs, to provide for the read/write circuits to work by comparison with a reference column including N transistors, all programmed in the same (i.e. all programmed or all blank), these transistors being controlled by the N line conductors of the memory.

The outputs of the columns of the pad position memory block define the r signals, p0, p1, p2, p3 (with their logic complements) which are necessary for the control of the multiplexer of the main memory. No decoding s necessary between the outputs of the memory and the control inputs of the multiplexer.

For the writing of the bits of this memory (the writing of one bit among r in each line), it is provided that the read/write circuit LE0 is connected to the pad of position 0 (D0 and D4), the circuit LE1 is connected to the pads of position 1 (D1 and D5), etc. Thus the programming of a pad position is done directly, without decoding: when the memory is being tested, an erroneous piece of information is detected on any pad whatsoever, for example D6. A bit is then placed on this pad to be recorded in the memory of the block MPP by means of the read/write circuit LE2 which is connected to this bit. The pad position P2 is thus memorized.

Should the integrated memory circuit according to the invention be a memory unerasable by ultraviolet light, for example when it is flash EPROM electrically erasable by blocks, the pad position memory of the block MPP may be an EPROM. It does not need to be shielded against the ultraviolet rays to which it is may be exposed, if the main memory is an EPROM with UV erasure window. As a consequence, the memory of the block MPP does not need to be shielded by aluminum masks and, above all, by protection labryrinths. These labyrinths are necessary to prevent lateral penetration by ultraviolet light during the erasure of the EPROM for this penetration would erase the redundancy data which must be preserved. The memory MPP would be far bulkier if it were provided with these protection labyrinths. The absence of an UV window for the flash EPROMS thus enables the surface area of the pad position memory to be reduced to the minimum, and this is particularly advantageous.

The invention can be applied especially when the number of possible pad positions is k, i.e. when their number is equal to the number of pads. For memories giving eight-bit or sixteen-bit words, there would therefore be eight or sixteen pad positions ($r=8$ or $r=16$) and it is for these memories that the invention is the most advantageous, for it considerably restricts the space occupied by the pad position decoding circuits which were necessary earlier.

What is claimed is:

1. An integrated memory comprising a main memory having a plurality of normal columns and a plurality of redundancy columns, k input/output pads, and a redundancy circuit; said redundancy circuit including pad position memorizing elements, each of said pad position memorizing elements being for memorizing a position of an input/output pad corresponding to a normal column in said main memory where such normal column is defective, wherein the pad position memorizing elements are electrically programmable memory cells, said pad position memorizing elements being equal in number to the number N of possible repairs multiplied by the number r of possible pad positions, said pad position memorizing elements being organized in an auxiliary memory of N lines and r columns, each column of this auxiliary memory corresponding to a determined pad position.

2. An integrated memory according to claim 1, wherein the information recorded in each line of the auxiliary memory includes a bit different from the $r-1$ other bits of the same line, this different bit being placed on the column in the auxiliary memory corresponding to a pad position associated with a defective normal column of the main memory.

3. An integrated memory according to claim 1 or claim 2, wherein each column of the auxiliary memory includes a respective column conductor connected to a respective read/write circuit, the reading outputs of these read/write circuits constituting the outputs of the auxiliary memory, and the input/output pads of a given pad position being connected to writing inputs of the read/write circuit of the auxiliary memory corresponding to this given pad position.

4. An integrated memory according to claim 1 or claim 2, wherein said main memory includes k groups of p columns, each group of columns corresponding to a respective pad, divided into m sets of r pad positions, with a group of redundancy columns associated with each set, and a multiplexer directly controlled by the outputs of the auxiliary memory to define whether the information transmitted to the pads should come from a normal column of the main memory or from a redundancy column of the main memory.

5. An integrated memory according to claim 4, wherein the multiplexer sets up the following connections from the column conductors of the auxiliary memory, these conductors providing signals corresponding to pad positions corresponding to selected normal columns in the main memory:

the signals coming from the columns of the auxiliary memory are all null (no need for repairs), all transmission from the redundancy columns of the main memory to the pads of the main memory or vice versa is barred, and the transmissions between the selected main memory normal columns and the corresponding pads are permitted;

if a repair is necessary and if it corresponds to a given pad position, then the transmission from the groups of normal columns with that given pad position towards the pads with that given pad is barred, and the transmission between the redundancy columns and these pads with that given pad position is permitted; the transmission between the pads having a pad position other than said given pad position and the normal columns in the main memory is permitted, and the transmission between said other pads and the redundancy columns is barred.

6. An integrated memory according to claim 1 or claim 2, including a redundancy column selection circuit, capable of selecting one redundancy column among N columns of a group of redundancy columns, and wherein the outputs of this redundancy column selection circuit directly control the lines of the auxiliary memory matrix.

* * * * *

UNITED STATES PATENT AND TRADEMARK OFFICE
CERTIFICATE OF CORRECTION

PATENT NO. : 5,058,068
DATED : October 15, 1991
INVENTOR(S) : Claude Costabello

It is certified that error appears in the above-identified patent and that said Letters Patent is hereby corrected as shown below:

```
Column 1, line 18, "2,6111,301" should be --2,611,301--.
Column 1, line 22, "ion" should be --in--.
Column 2, line 28, "FR 87/02371" should be --FR 87/02372--.
Column 3, line 36, "element" should be --elements--.
Column 3, line 39, "got" should be --achieved--.
Column 4, line 12, "(EEPROMs)" should be --(EEPROMs,--.
Column 4, line 58, "in to" should be --into--.
Column 5, line 16 "a first of all" should be --first of all--.
Column 5, line 50 "or" should be --of--.
Column 7, line 6, after "same" insert --way--.
Column 7, line 10, "p0, p1, p2, p3" should be --P0, P1, P2, P3--.
Column 7, line 29, after "is" insert --a--.
Column 7, line 32, after "it" delete --is--.
Column 8, line 40, before "the" insert --if--.
Column 8, line 50, after "pad" insert --position--.
```

Signed and Sealed this

Thirtieth Day of March, 1993

Attest:

STEPHEN G. KUNIN

Attesting Officer

Acting Commissioner of Patents and Trademarks